(12) United States Patent
Malladi et al.

(10) Patent No.: US 8,803,569 B1
(45) Date of Patent: Aug. 12, 2014

(54) RAMP GENERATOR USING OPERATIONAL AMPLIFIER BASED INTEGRATION AND SWITCHED CAPACITOR TECHNIQUES

(71) Applicant: International Business Machines Corporation, Armonk, NY (US)

(72) Inventors: Anjali R. Malladi, Williston, VT (US); Todd M. Rasmus, Cary, NC (US); Pradeep Thiagarajan, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/928,466

(22) Filed: Jun. 27, 2013

(51) Int. Cl.
*H03K 4/06* (2006.01)

(52) U.S. Cl.
USPC .......................................... 327/131

(58) Field of Classification Search
USPC .......................................... 327/131
See application file for complete search history.

(56) References Cited

U.S. PATENT DOCUMENTS

| | | | |
|---|---|---|---|
| 7,583,113 B2 | 9/2009 | Celani | |
| 7,948,280 B2 | 5/2011 | Dwarakanath et al. | |
| 2002/0186069 A1 | 12/2002 | Hochschild | |
| 2006/0164277 A1* | 7/2006 | Lee | 341/155 |
| 2010/0109736 A1 | 5/2010 | Lu | |
| 2011/0043270 A1 | 2/2011 | Kusuda | |
| 2012/0001055 A1 | 1/2012 | Lee | |

FOREIGN PATENT DOCUMENTS

| | | |
|---|---|---|
| JP | 54033017 | 3/1979 |
| JP | 04024566 | 1/1992 |
| WO | 2009002120 | 12/2008 |

OTHER PUBLICATIONS

Jader A. De Lima et al., "A gm-C Ramp Generator for Voltage Feedforward Control of DC-DC Switching Regulations", 1-4244-0921-7/07, © 2007 IEEE, pp. 1919-1922.

* cited by examiner

*Primary Examiner* — Daniel Rojas
(74) *Attorney, Agent, or Firm* — Keivan E. Razavi; Joseph Petrokaitis (57) ABSTRACT

A ramp generator circuit for generating sawtooth waveforms based on a clock signal may include an operational amplifier, a first switched capacitor device within a first feedback path of the operational amplifier, and a first plurality of switch devices within the first feedback path, whereby upon actuation of the first plurality of switches, the first switched capacitor generates first ramp waveforms during first alternate clock periods of the clock signal. The circuit may also include a second switched capacitor device within a second feedback path of the operational amplifier, and a second plurality of switch devices within the second feedback path, whereby upon actuation of the second plurality of switches, the second switched capacitor generates second ramp waveforms during second alternate clock periods of the clock signal. The first alternate clock periods of the clock are followed by an adjacent one of the second alternate clock periods of the clock.

20 Claims, 6 Drawing Sheets

RAMP GENERATOR USING OPERATIONAL AMPLIFIER BASED INTEGRATION AND SWITCHED CAPACITOR TECHNIQUES

FIELD OF THE INVENTION

The present application relates generally to a signal generation apparatus and method, and more specifically, to an apparatus and method corresponding to an operational amplifier based ramp generator.

BACKGROUND AND RELATED ART

Ramp generators typically generate sawtooth waveforms and are used in a myriad of applications. For example, sawtooth waves are, among other things, perhaps best known for their use in music waveform generation. Another application of ramp generators is in power conversion systems using pulse width modulation. Power converters may frequently be used to power loads having tight regulation characteristics. To provide voltage conversion and regulations, the power converters may use active switches that are coupled to a voltage source and periodically switch a reactive circuit element (e.g., inductor) to the voltage source at a switching frequency in the order of a few MHz or lower. Accordingly, controllers employing ramp generators may be required to manage the operation of the power convertors by controlling the conduction periods of the switches employed in the power converter.

Ramp generators creating sawtooth waveforms may also be employed to produce vertical and horizontal deflection signals used to generate a raster on CRT-based television or monitor screens. Oscilloscopes also use a sawtooth waveform for their horizontal deflection, though they typically use electrostatic deflection. On the sawtooth waveforms ramp portion, the magnetic field produced by the deflection yoke drags the electron beam across the face of the CRT, creating a scan line. On the sawtooth waveforms cliff, the magnetic field suddenly collapses, causing the electron beam to return to its resting position as quickly as possible. Thus, a linear ramp and sharp cliff may be desired.

Figure 1:
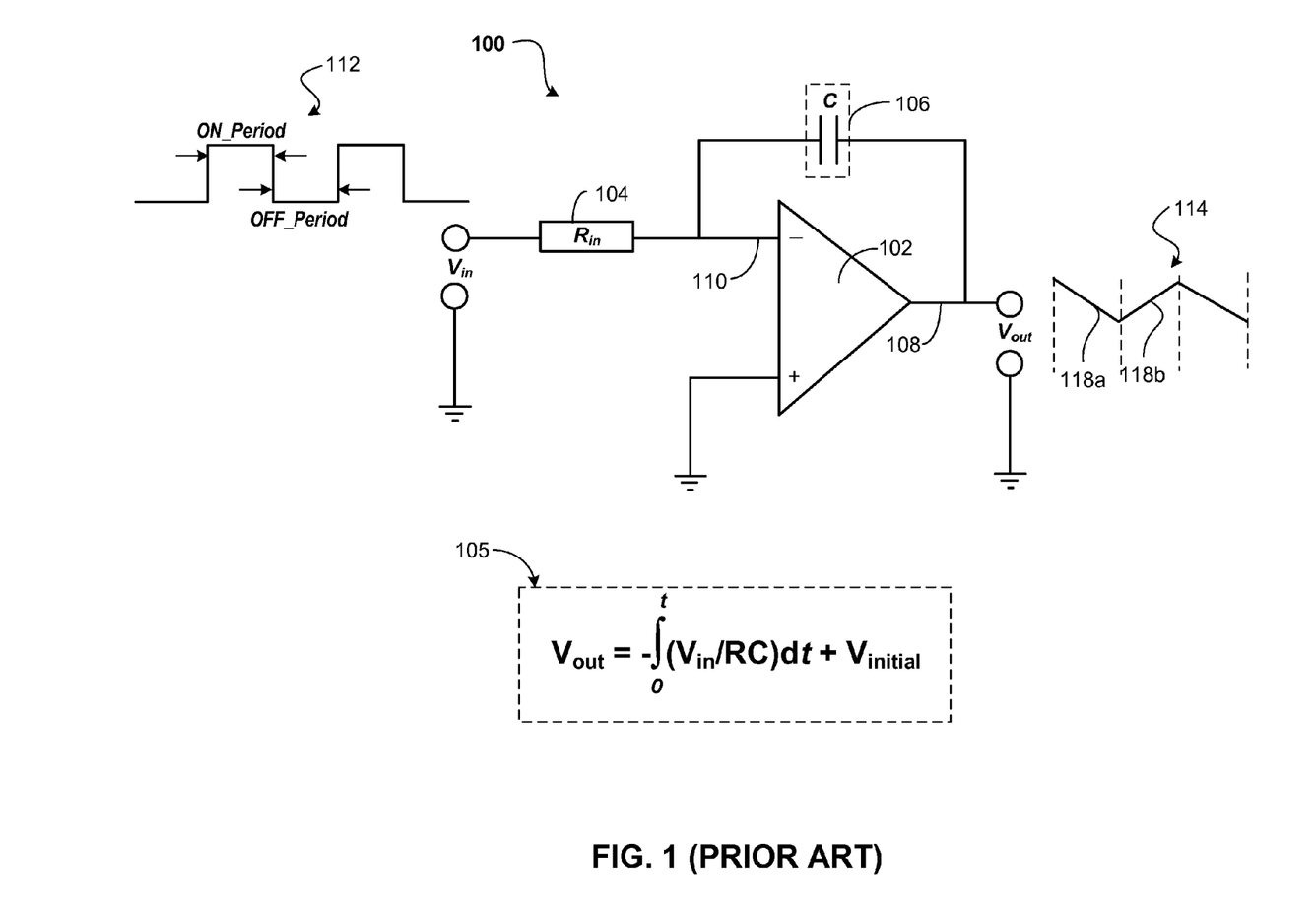
FIG. 1 illustrates a conventional ramp generator, as known in the art.

FIG. 1 illustrates a conventional ramp generator, as known in the art. As depicted, an operational amplifier based integrator 100 may include an operational amplifier (Op Amp) 102, an input resistor 104, and a capacitor 106 located within the negative feedback path between the output terminal 108 and the negative input terminal 110 of the Op Amp 102. The capacitor 106 and resistor 104 determine the RC time constant of the integrator 100, whereby based on relationship 105 (also recited below), the integrator 100 integrates input square wave 112 in order to generate output ramp signal 114.

$$V_{out} = -\int_0^t (V_{in}/RC)\,dt + V_{intial}$$

For example, the high level of ramp generator 100 may be set to a voltage potential that is higher than ground, while the low level may be set to be below ground (i.e., a negative voltage). As depicted, the ON_Period of the input square wave 112 may result in a downward slope ramp portion 118a of output signal 114, which may be generated based on the plate of the capacitor 106 at the negative terminal building positive charge and the other terminal of the capacitor 106 at $V_{out}$ building negative charge. Conversely, during the OFF_Period of the input square wave 112, the capacitor 106 charges up to produce upward slope ramp portion 118b of output ramp signal 114. Thus, a triangular type waveform may be generated. In contrast with a desired sawtooth waveform profile, based on the finite discharge time requirement for capacitor 106, the output ramp signal 114 may fail to exhibit a sharp or steep drop to ground or another designated reference voltage.

It may, therefore, be advantageous, among other things, to provide an enhanced ramp generator for optimizing the generation of saw tooth waveforms over various clock frequencies.

SUMMARY

According to an exemplary embodiment, an enhanced integrator circuit may be utilized as a ramp generator and configured to produce a sawtooth output signal. According to such an exemplary embodiment, the sawtooth signal includes ramp signals that are generated by alternating between separately switched resistor/capacitance (RC) paths associated with the negative feedback paths of an operational amplifier (OP Amp).

According to another exemplary embodiment, a ramp generator circuit for generating a sawtooth waveform based on a clock signal may include an operational amplifier having an output terminal and a negative input terminal, a first switched capacitor device within a first feedback path located between the output terminal and the negative input terminal, and a first plurality of switch devices within the first feedback path, whereby upon actuation of the first plurality of switches, the first switched capacitor generates first ramp waveforms during first alternate clock periods of the clock signal. The circuit also includes a second switched capacitor device within a second feedback path located between the output terminal and the negative input terminal, and a second plurality of switch devices within the second feedback path, whereby upon actuation of the second plurality of switches, the second switched capacitor generates second ramp waveforms during second alternate clock periods of the clock signal. Each of the first alternate clock periods of the clock signal are followed by an adjacent one of the second alternate clock periods of the clock signal.

According to yet another exemplary embodiment, a method of generating a sawtooth waveform based on an operational amplifier may include generating a clock signal and activating a first negative feedback path associated with the operational amplifier by switching a first capacitor into the first negative feedback path during first alternate clock periods of the clock signal, whereby the first capacitor generates a first ramp waveform. A second negative feedback path associated with the operational amplifier is activated by switching a second capacitor into the second negative feedback path during second alternate clock periods of the clock signal, whereby the second capacitor generates a second ramp waveform. Each of the first alternate clock periods of the clock signal are followed by an adjacent one of the second alternate clock periods of the clock signal.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following ramp generator circuits and their corresponding operational methods generate enhanced saw tooth waveforms for various device and/or system applications. More specifically, the exemplary circuit configuration allows sufficient discharge times for the integration capacitors generating the slopes of the sawtooth waveform. This in turn may facilitate the incorporation of the circuits within, for example, application-specific integrated circuits (ASICs), where large magnitude discharge currents would likely create stress within the ASIC.

Figure 2:
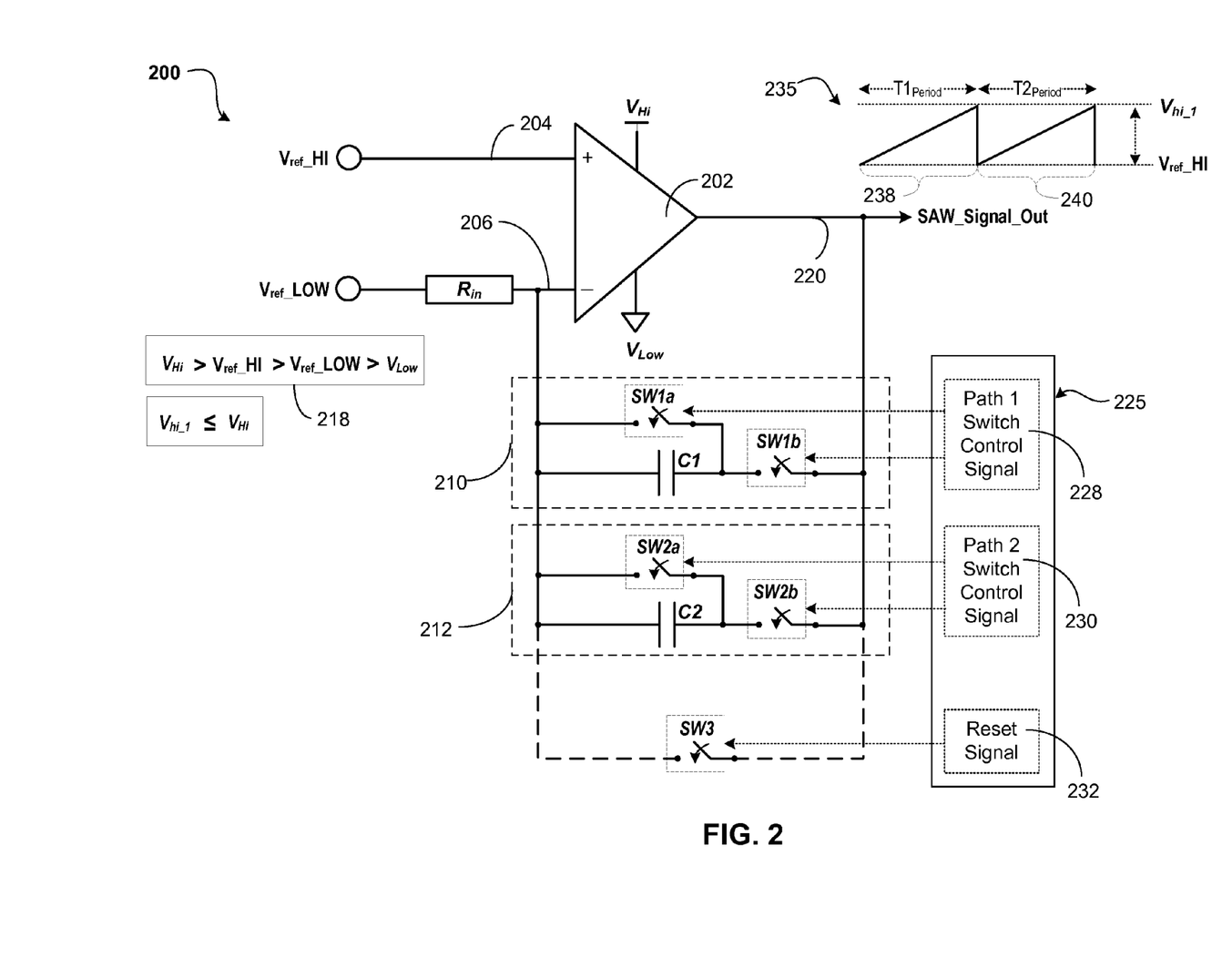
FIG. 2 is a ramp generator circuit, according to an exemplary embodiment.

FIG. 2 refers to an operational amplifier (Op Amp) based ramp generator circuit 200 according to an exemplary embodiment. The ramp generator circuit 200 may include an operational amplifier 202 having a positive input terminal 204, a negative input terminal 206, an input resistor $R_{in}$, a first negative feedback path 210, a second negative feedback path 212, and a reset switch SW3.

The positive input terminal 204 of the ramp generator 200 is coupled to a reference voltage denoted as $V_{ref\_}$HI. Similarly, the negative input terminal 206 of the ramp generator 200 is coupled to another reference voltage $V_{ref\_}$LOW via input resistor $R_{in}$. Also, voltages $V_{Hi}$ and $V_{Low}$ provide the supply voltages of the operation amplifier 202. The voltage magnitude relationship between the supply voltages $V_{Hi}$, $V_{Low}$ and the reference voltages $V_{ref\_}$HI, $V_{ref\_}$LOW is indicated at 218, whereby:

$$V_{Hi} > V_{ref\_HI} > V_{ref\_LOW} > V_{Low}$$

As depicted, the first negative feedback path 210 is connected between the output terminal 220 and the negative input terminal 206 of the operational amplifier 202. The first negative feedback path 210 may include capacitor C1 and switches SW1a and SW1b. Similarly, the second negative feedback path 212 is also connected between the output terminal 220 and the negative input terminal 206 of the operational amplifier 202. The second negative feedback path 212 may include capacitor C2 and switches SW2a and SW2b. As described in more detail in the following paragraphs, the actuation of switches SW1a, SW1b, SW2a, and SW2b activate the first or the second negative feedback paths in an alternating pattern.

For example, while first negative feedback path 210 is generating a ramp signal at the output terminal 220 during a first activation period, the second negative feedback path 212 is isolated from the output terminal 220. Vice versa, when second negative feedback path 212 is generating another ramp signal at the output terminal 220 during a second activation period, the first negative feedback path 210 is now isolated from the output terminal 220. The activation periods alternate with respect to a clock signal, whereby the first activation period occurs during one period of the clock while the second activation period occurs during the next adjacent period of the clock. After the second activation period occurs, on the next adjacent clock period the first activation period occurs and the alternating pattern of activation continues. This is described in more detail with respect to FIG. 4.

Moreover, switch SW3 provides a reset mechanism whereby upon the closing of switch SW3, the operational amplifier is configured from an integrator to a unity gain amplifier. Thus, as a unity gain amplifier, the signal at output terminal 220 resets to the value of the reference voltage $V_{ref\_}$HI at the positive terminal 204 of the operational amplifier 202.

In the above-described configuration of the ramp generator 200, the first negative feedback path 210 operates as an integrator having an RC time constant determined by the value of capacitor C1 and input resistor $R_{in}$. The second negative feedback path 212 also operates as an integrator having an RC time constant determined by the value of capacitor C2 and input resistor $R_{in}$. In some implementations, the RC time constant for both feedback paths 210 and 212 are approximately the same. In other implementations, however, the RC time constant for both feedback paths 210 and 212 may be set to different values.

Switches SW1a and SW1b within the first feedback path 210, switches SW2a and SW2b within the second feedback path 212, and the reset switch SW3 are controlled and actuated using timing control circuit 225. As illustrated, the path 1 switch control signal 228 is generated by the timing control circuit 225 and controls the actuation of switches SW1a and SW1b within the first feedback path 210. The path 2 switch control signal 230 is also generated by the timing control circuit 225 and controls the actuation of switches SW2a and SW2b within the second feedback path 212. The reset signal 232 generated by the timing control circuit 225 controls the actuation of reset switch SW3. An exemplary embodiment of timing control circuit 225 is described below in relation to FIG. 4A.

Based on the operation of the ramp generator 200, sawtooth signal SAW_Signal_Out is generated at output terminal 220. As depicted at 235, the signal SAW_Signal_Out includes ramp portions 238 and 240. Over period $T1_{Period}$, ramp portion 238 includes a positive slope voltage increase from $V_{ref\_}$HI up to voltage level $V_{hi\_1}$ (i.e., $V_{Hi} \geq V_{hi\_1}$) and a substantially sharp falling edge (e.g., approximately perpendicular) back to $V_{ref\_}$HI prior to $T2_{Period}$. Similarly, over period $T2_{Period}$, ramp portion 240 also includes a positive slope voltage increase from $V_{ref\_}$HI up to voltage level $V_{hi\_1}$ (i.e., $V_{Hi} \geq V_{hi\_1}$) and a substantially sharp falling edge (e.g., approximately perpendicular) back to $V_{ref\_}$HI prior to the next period (not shown). Thus, the ramp portion 238 over period $T1_{Period}$ is generated by the first negative feedback path 210 while the ramp portion 240 over period $T2_{Period}$ is generated by the second negative feedback path 212. Each feedback path therefore generates a ramp portion during alternate periods of a clock signal. This timing aspect is described in relation to FIG. 4B below.

Figure 3:
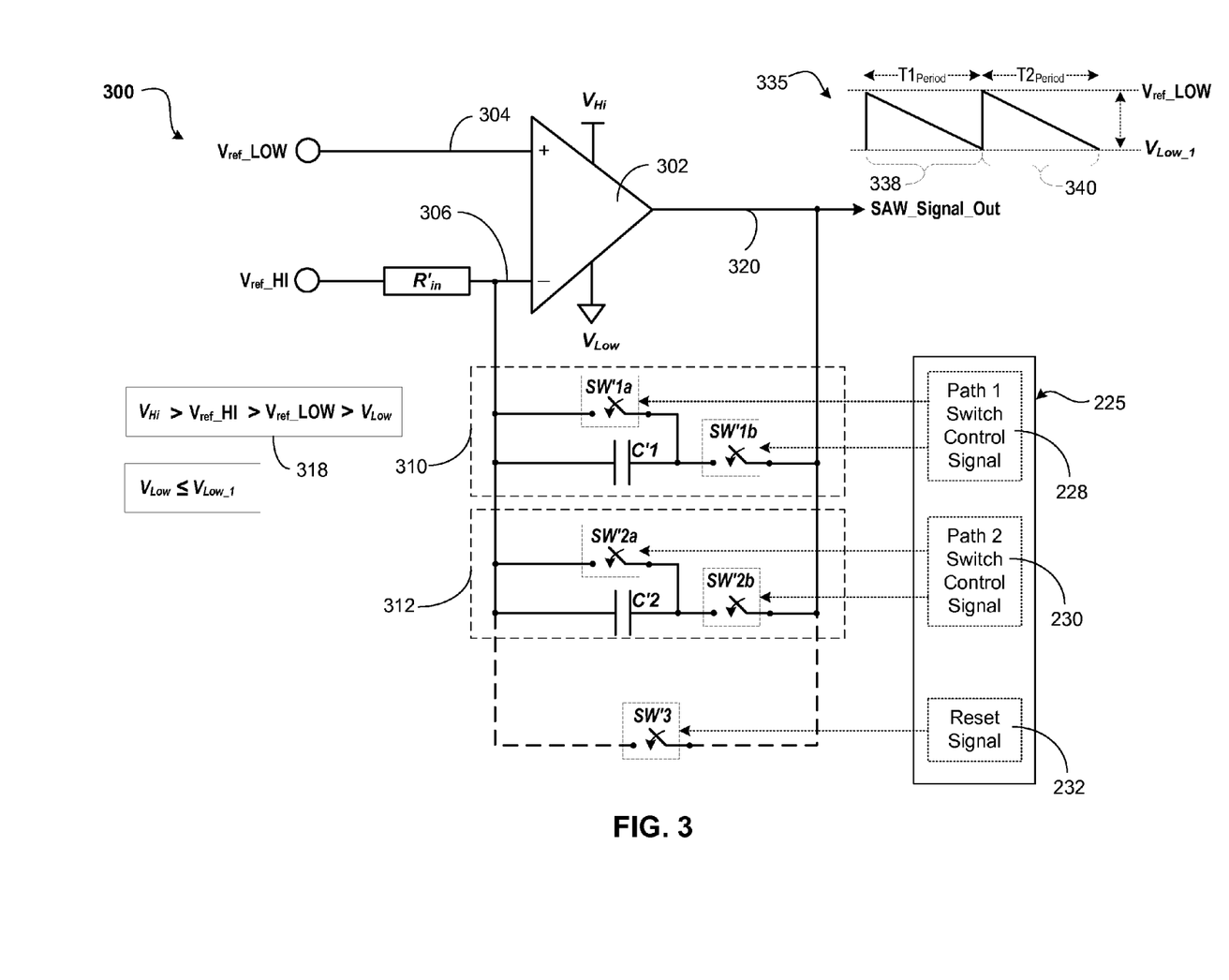
FIG. 3 is a ramp generator circuit, according to another exemplary embodiment.

FIG. 3 refers to an operational amplifier (Op Amp) based ramp generator circuit 300 according to another exemplary embodiment. The ramp generator circuit 300 may include an operational amplifier 302 having a positive input terminal 304, a negative input terminal 306, an input resistor R'$_{in}$, a first negative feedback path 310, a second negative feedback path 312, and a reset switch SW'3.

The positive input terminal 304 of the ramp generator 300 is coupled to a reference voltage denoted as V$_{ref\_}$LOW. Similarly, the negative input terminal 306 of the ramp generator 300 is coupled to another reference voltage V$_{ref\_}$HI via input resistor R'$_{in}$. Also, voltages V$_{Hi}$ and V$_{Low}$ provide the supply voltages of the operation amplifier 302. The voltage magnitude relationship between the supply voltages V$_{Hi}$, V$_{Low}$ and the reference voltages V$_{ref\_}$HI, V$_{ref\_}$LOW is indicated at 318, whereby:

$$V_{Hi} > V_{ref\_HI} > V_{ref\_LOW} > V_{Low}$$

As depicted, the first negative feedback path 310 is connected between the output terminal 320 and the negative input terminal 306 of the operational amplifier 302. The first negative feedback path 310 may include capacitor C'1 and switches SW'1$a$ and SW'1$b$. Similarly, the second negative feedback path 312 is also connected between the output terminal 320 and the negative input terminal 306 of the operational amplifier 302. The second negative feedback path 312 may include capacitor C'2 and switches SW'2$a$ and SW'2$b$. As described in more detail in the following paragraphs, the actuation of switches SW'1$a$, SW'1$b$, SW'2$a$, and SW'2$b$ activate the first or the second negative feedback paths in an alternating pattern.

For example, while first negative feedback path 310 is generating a ramp signal at the output terminal 320 during a first activation period, the second negative feedback path 312 is isolated from the output terminal 320. Vice versa, when second negative feedback path 312 is generating another ramp signal at the output terminal 320 during a second activation period, the first negative feedback path 310 is now isolated from the output terminal 320. The activation periods alternate with respect to a clock signal, whereby the first activation period occurs during one period of the clock while the second activation period occurs during the next adjacent period of the clock. After the second activation period occurs, on the next adjacent clock period the first activation period occurs and the alternative pattern of activation continues. This is described in more detail with respect to FIGS. 4-6.

Moreover, switch SW'3 provides a reset mechanism whereby upon the closing of switch SW'3, the operational amplifier is configured from an integrator to a unity gain amplifier. Thus, as a unity gain amplifier, the signal at output terminal 320 resets to the value of the reference voltage V$_{ref\_}$LOW at the positive terminal 304 of the operational amplifier 302.

In the above-described configuration of the ramp generator 300, the first negative feedback path 310 operates as an integrator having an RC time constant determined by the value of capacitor C'1 and input resistor R'$_{in}$. The second negative feedback path 312 also operates as an integrator having an RC time constant determined by the value of capacitor C'2 and input resistor R'$_{in}$. In some implementations, the RC time constant for both feedback paths 310 and 312 are approximately the same. In other implementations, however, the RC time constant for both feedback paths 310 and 312 may be set to different values.

Switches SW'1$a$ and SW'1$b$ within the first feedback path 310, switches SW'2$a$ and SW'2$b$ within the second feedback path 312, and the reset switch SW'3 are controlled and actuated using timing control circuit 225. As illustrated, the path 1 switch control signal 228 is generated by the timing control circuit 225 and controls the actuation of switches SW'1$a$ and SW'1$b$ within the first feedback path 310. The path 2 switch control signal 230 is also generated by the timing control circuit 225 and controls the actuation of switches SW'2$a$ and SW'2$b$ within the second feedback path 312. The reset signal 232 generated by the timing control circuit 225 controls the actuation of reset switch SW'3. As previously indicated, an exemplary embodiment of timing control circuit 225 is described below in relation to FIG. 4A.

Based on the operation of the ramp generator 300, sawtooth signal SAW_Signal_Out is generated at output terminal 320. As depicted at 335, the signal SAW_Signal_Out includes ramp portions 338 and 340. Over period T1$_{Period}$, ramp portion 338 includes a negative slope voltage transition from V$_{ref\_}$LOW down to voltage level V$_{Low\_1}$ (i.e., V$_{Low\_1}$≥V$_{Low}$) and a substantially sharp rising edge (e.g., approximately perpendicular) back to V$_{ref\_}$LOW prior to T2$_{Period}$. Similarly, over period T2$_{Period}$, ramp portion 340 also includes a negative slope voltage transition from V$_{ref\_}$LOW down to voltage level V$_{Low\_1}$ (i.e., V$_{Low\_1}$≥V$_{Low}$) and a substantially sharp rising edge (e.g., approximately perpendicular) back to V$_{ref\_}$LOW prior to the next period (not shown). Thus, the ramp portion 338 over period T1$_{Period}$ is generated by the first negative feedback path 310 while the ramp portion 340 over period T2$_{Period}$ is generated by the second negative feedback path 312. Each feedback path generates a ramp portion during alternate periods of a clock signal. This timing relationship is described in with reference to FIG. 4B hereinafter.

Figure 4A:
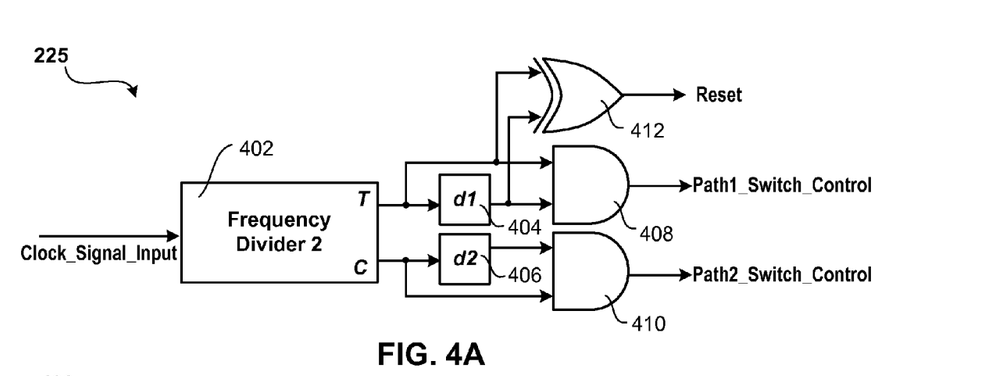
FIG. 4A is an exemplary embodiment of a timing control circuit for controlling the switching of the feedback paths corresponding to the ramp generators depicted in FIGS. 2 and 3.

FIG. 4A depicts an exemplary embodiment of a timing control circuit 225 for controlling the switching of the feedback paths corresponding to ramp generators 200 and 300 shown in FIGS. 2 and 3, respectively. The timing circuit may include a divide-by-two frequency divider 402 (e.g., a Flip-Flop), delay devices 404 and 406, AND gates 408 and 410, and XOR gate 412. The divide-by-two frequency divider 402 receives a clock signal and generates a true and complementary version (i.e., inverted version) of the divided (÷2) clock signal with a 50% duty cycle. The delay devices 404, 406 each provide a time delayed version of their respective input signals and may, according to some implementation, include one or more inverter gates. For example, delay devices 404 and 406 may each include two inverter gates (not shown), whereby the time delays are determined by the propagation delay introduced by each inverter.

Figure 4B:
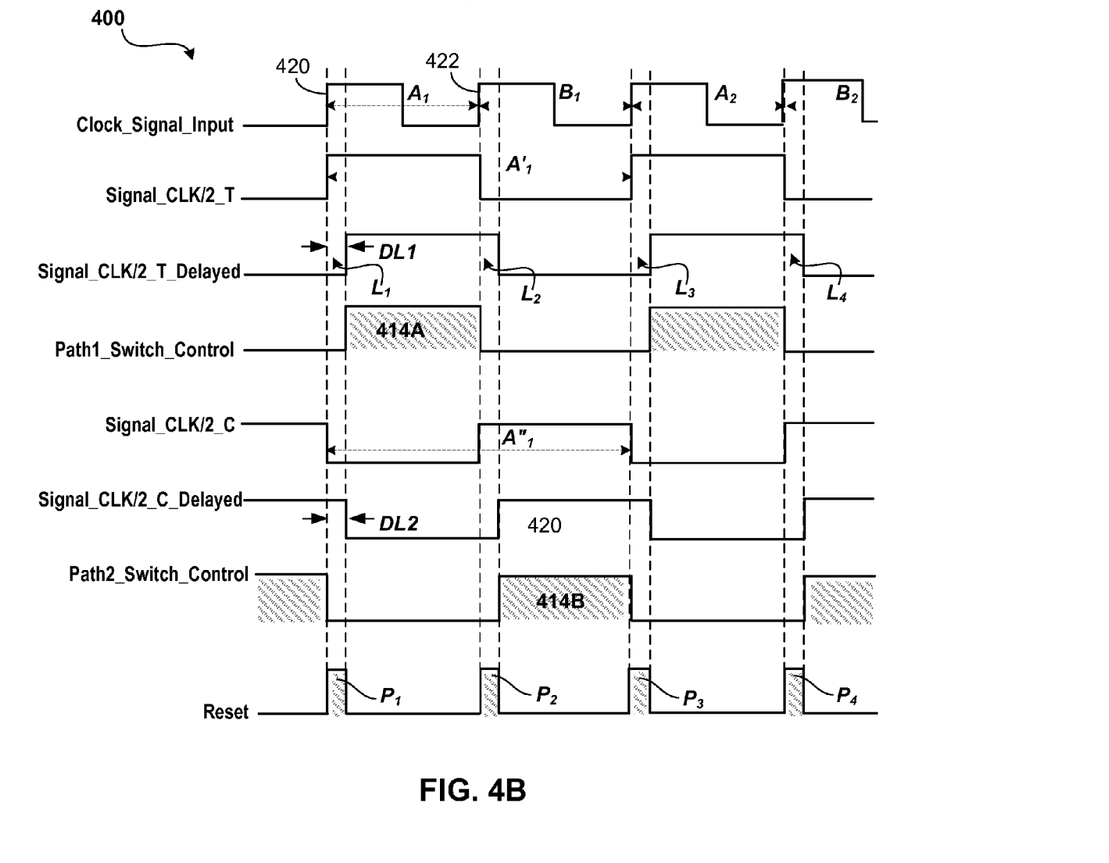
FIG. 4B illustrates timing waveforms corresponding to the timing control circuit of FIG. 4A, according to one embodiment.

FIG. 4B illustrates the timing waveforms 400 generated by the timing control circuit 225 depicted in FIG. 4A. The operation of the timing control circuit 225 will now be described with aid of the waveforms 400 of FIG. 4B. As previously indicated, the timing control circuit 225 receives a clock signal, and based on the clock signal, generates waveforms that control the operation of the switches used in the feedback paths of ramp generator 200 (FIG. 2) and 300 (FIG. 3).

Referring to FIGS. 4A and 4B, in operation, the divide-by-two frequency divider 402 receives a clock signal, as denoted by Clock_Signal_Input. At the output of the divide-by-two frequency divider 402, the clock signal Clock_Signal_Input is divided by two, whereby divided clock signal Signal_CLK/2_T (i.e., a first reference signal) and a complementary version of the divided clock signal Signal_CLK/2_C (i.e., a second reference signal) are generated. As illustrated in the waveforms, period A$_1$ of the clock signal Clock_Signal_Input is half that of the period A'$_1$ of the divided clock signal Signal_CLK/2_T. Also, period A$_1$ of the clock signal Clock_Signal_Input is half that of the period A"$_1$ of the complementary divided clock signal Signal_CLK/2_C.

The divided clock signal Signal_CLK/2_T output from the divide-by-two frequency divider 402 is then delayed, as indicated by DL1, by delay device 404. Thus, a delayed divided clock signal Signal_CLK/2_T_Delayed is generated at the output of device 404. Similarly, the complementary or inverted version of the divided clock signal Signal_CLK/2_C also output from the divide-by-two frequency divider 402 is delayed, as indicated by DL2, by delay device 406. Thus, a delayed complementary version of the divided clock signal Signal_CLK/2_C Delayed is generated at the output of device 404. The DL1 and DL2 delays are configured to be approximately the same. However, some other implementations may contemplate the use of different delay amounts.

The delayed divided clock signal Signal_CLK/2_T_Delayed and the divided clock signal Signal_CLK/2_T are applied to the input of AND gate 408 in order to generate the path 1 switch control signal Path1_Switch_Control. Similarly, the delayed complementary divided clock signal Signal_CLK/2_C Delayed and the complementary divided clock signal Signal_CLK/2_C are applied to the input of AND gate 410 in order to generate the path 2 switch control signal Path2_Switch_Control.

As depicted, the path 1 switch control signal Path1_Switch_Control generates an activation period (i.e., logic 1 or logic high duration) 414A within or during period $A_1$ of the clock signal Clock_Signal_Input. During this activation period 414A, the first feedback path 210 (FIG. 2) switches SW1$a$, SW1$b$ are actuated in order to generate, for example, ramp portion 238 (FIG. 2). Similarly, the path 2 switch control signal Path2_Switch_Control generates an activation period (i.e., logic 1 or logic high duration) 414B within or during period $B_1$ of the clock signal Clock_Signal_Input. During this activation period 414B, the second feedback path 212 (FIG. 2) switches SW1$a$, SW1$b$ are actuated in order to generate, for example, ramp portion 240 (FIG. 2). Therefore, each feedback path 210, 212 may generate a ramp portion 238, 240 on alternate periods $A_1$, $B_1$ of the clock signal Clock_Signal_Input. More specifically, feedback path 210 generates ramp portion 238 on period $A_1$ of the clock signal Clock_Signal_Input, while feedback path 212 generates ramp portion 240 on the next alternate period $B_1$ of the clock signal Clock_Signal_Input. Since each feedback path generates a ramp portion on alternating clock pulses, each of the feedback paths undergo capacitive discharge during intermediate clock periods. For example, once feedback path 210 generates ramp portion 238 on period $A_1$ of the clock signal Clock_Signal_Input, on period $B_1$ of the clock signal Clock_Signal_Input, the charge across capacitor C1 (FIG. 2) of feedback path 210 is discharged. Similarly, once feedback path 212 generates ramp portion 240 on period $B_1$ of the clock signal Clock_Signal_Input, on period $A_2$ of the clock signal Clock_Signal_Input, the charge across capacitor C2 (FIG. 2) of feedback path 212 is discharged.

Moreover, the delayed divided clock signal Signal_CLK/2_T_Delayed and the divided clock signal Signal_CLK/2_T are applied to the input of XOR gate 412 in order to generate a reset signal Reset. Since the XOR gate 412 generates a logic '1' output based on its inputs having different logic levels, the reset signal Reset pulse period is generated based on the existing delay DL1 between the Signal_CLK/2_T_Delayed and the Signal_CLK/2_T signals, which have different logic levels. Thus, during time intervals $L_1$-$L_4$, reset pulses $P_1$-$P_4$ are generated by XOR gate 412.

As depicted, the reset signal Reset pulse periods are generated on the rising edge of each clock pulse. For example, reset pulse $P_1$ is generated on rising edge 420 of the clock signal Clock_Signal_Input, while reset pulse $P_2$ is generated on the next rising edge 422 of the clock signal Clock_Signal_Input. Within each clock period, both a reset pulse and an activation period are generated. For example, within period $A_1$ of the clock signal Clock_Signal_Input, reset pulse $P_1$ and activation period 414A are generated. Likewise, within period $B_1$ of the clock signal Clock_Signal_Input, reset pulse $P_2$ and activation period 414B are generated.

Figure 5:
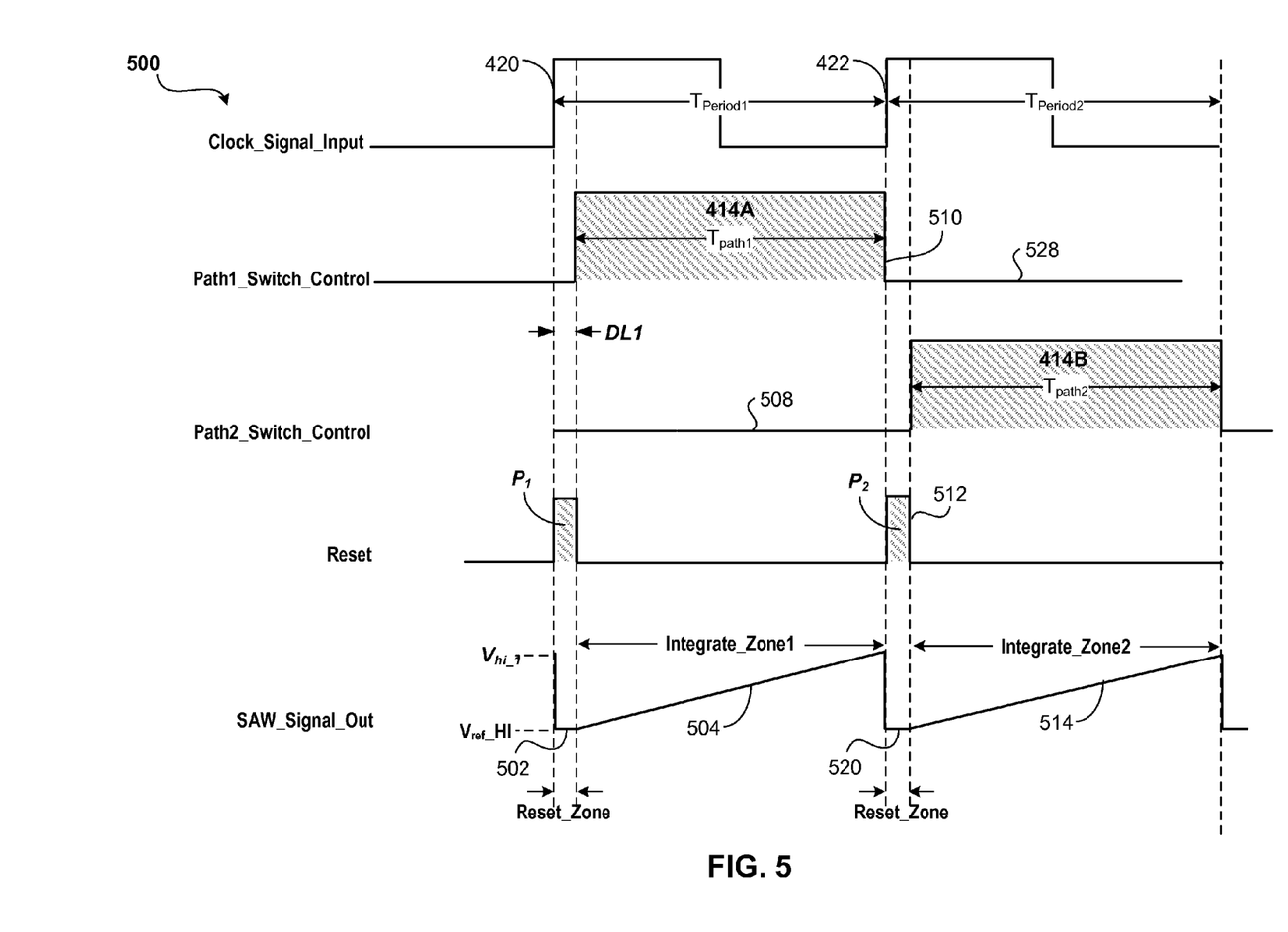
FIG. 5 illustrates timing waveforms corresponding to the ramp generator circuit of FIG. 2, according to one embodiment.

FIG. 5 illustrates timing waveforms 500 corresponding to the operation of the ramp generator circuit 200 of FIG. 2, according to one embodiment. In FIG. 5, the Clock_Signal_Input, Path1_Switch_Control, Path2_Switch_Control, and Reset signals are identical to those shown in FIG. 4B. Thus, the operation of the ramp generator circuit 200 of FIG. 2 is described in the following paragraphs with the aid of the waveforms depicted in FIGS. 4B and 5. On the rising edge 420 of the clock signal Clock_Signal_Input, reset pulse $P_1$ resets the output terminal 220 voltage of the ramp generator 200 (FIG. 2) to $V_{ref\_}$HI (FIG. 2), as further indicated at 502. Following time delay period DL1, which coincides with the duration of the reset pulse $P_1$, the path 1 switch control signal Path1_Switch_Control generates activation period 414A. Activation period 414A may then be utilized to actuate the position of switches SW1$a$ (FIG. 2) and SW1$b$ (FIG. 2) within feedback path 210 (FIG. 2). For example, the activation period 414A may facilitate the actuation of switch SW1$b$ (FIG. 2) to a closed position and SW1$a$ (FIG. 2) to an open position. Based on this switch configuration, the first feedback path 210 (FIG. 2) and its corresponding capacitor C1 (FIG. 2) generate positive slope ramp 504 over the duration $T_{path1}$ of activation period 414A.

During activation period 414A, the path 2 switch control signal Path2_Switch_Control is at a logic low 508, and facilitates the actuation of the position of switches SW2$a$ (FIG. 2) and SW2$b$ (FIG. 2) within the second feedback path 212 (FIG. 2) to a closed position and an open position, respectively. By SW2$b$ (FIG. 2) being in an open position, feedback path 212 (FIG. 2) is effectively removed. By closing switch SW2$a$ (FIG. 2), capacitor C2 (FIG. 2) within feedback path 212 (FIG. 2) discharges along a path to the positive terminal 204 (FIG. 2) of the ramp generator 200, which is held at $V_{ref\_}$HI (FIG. 2). Moreover during this activation period 414A, the reset signal Reset is at a logic zero, which is indicative of SW3 (FIG. 2) being in an open position.

At the end of the activation period 414A, as indicated at 510, the next reset pulse $P_2$ actuates SW3 (FIG. 2) to a closed position on the next rising edge 422 of the clock signal Clock_Signal_Input. Also, at this time instant, both the path 1 switch control signal Path1_Switch_Control and the path 2 switch control signal Path2_Switch_Control are at a logic low, and, therefore, switches SW1$b$ (FIG. 2) and SW2$b$ (FIG. 2) are in the open position, and switches SW1$a$ (FIG. 2) and SW2$a$ (FIG. 2) are in the closed position. By SW1$b$ (FIG. 2) and SW2$b$ (FIG. 2) being in open positions, feedback paths 210 (FIG. 2) and 212 (FIG. 2) are effectively removed. By closing switches SW1$a$ (FIG. 2) and SW2$a$ (FIG. 2), capacitors C1 (FIG. 2) and C2 (FIG. 2) within feedback paths 210 (FIG. 2) and 212 (FIG. 2) discharge along the path to the positive terminal 204 (FIG. 2) of the ramp generator 200 (FIG. 2), which is held at $V_{ref\_}$HI (FIG. 2). Thus, over the period of reset pulse $P_2$, the voltage at output terminal 220 (FIG. 2) of the ramp generator 200 (FIG. 2) transitions to $V_{ref\_}$HI, as further indicated at 520.

When the duration of reset pulse $P_2$ finishes, as indicated at 512, the path 2 switch control signal Path2_Switch_Control generates activation period 414B. Activation period 414B may then be utilized to actuate the position of switches SW2$a$ (FIG. 2) and SW2$b$ (FIG. 2) within feedback path 212 (FIG. 2). For example, the activation period 414B may facilitate the actuation of switch SW2$b$ (FIG. 2) to a closed position and SW2$a$ (FIG. 2) to an open position. Based on this switch configuration, the second feedback path 212 (FIG. 2) and its corresponding capacitor C2 (FIG. 2) generate positive slope ramp 514 over the duration $T_{path2}$ of activation period 414B.

During activation period 414B, the path 1 switch control signal Path1_Switch_Control is at a logic low 528, and facilitates the actuation of the position of switches SW1a (FIG. 2) and SW1b (FIG. 2) within the first feedback path 210 (FIG. 2) to a closed position and an open position, respectively. By SW1b (FIG. 2) being in an open position, feedback path 210 (FIG. 2) is now effectively removed. By closing switch SW1a (FIG. 2), capacitor C1 (FIG. 2) within feedback path 210 (FIG. 2) discharges along the path to the positive terminal 204 (FIG. 2) of the ramp generator 200 (FIG. 2), which is held at $V_{ref\_}$HI (FIG. 2). Moreover during this activation period 414B, the reset signal Reset is at a logic zero, which is indicative of SW3 (FIG. 2) being in an open position.

Figure 6:
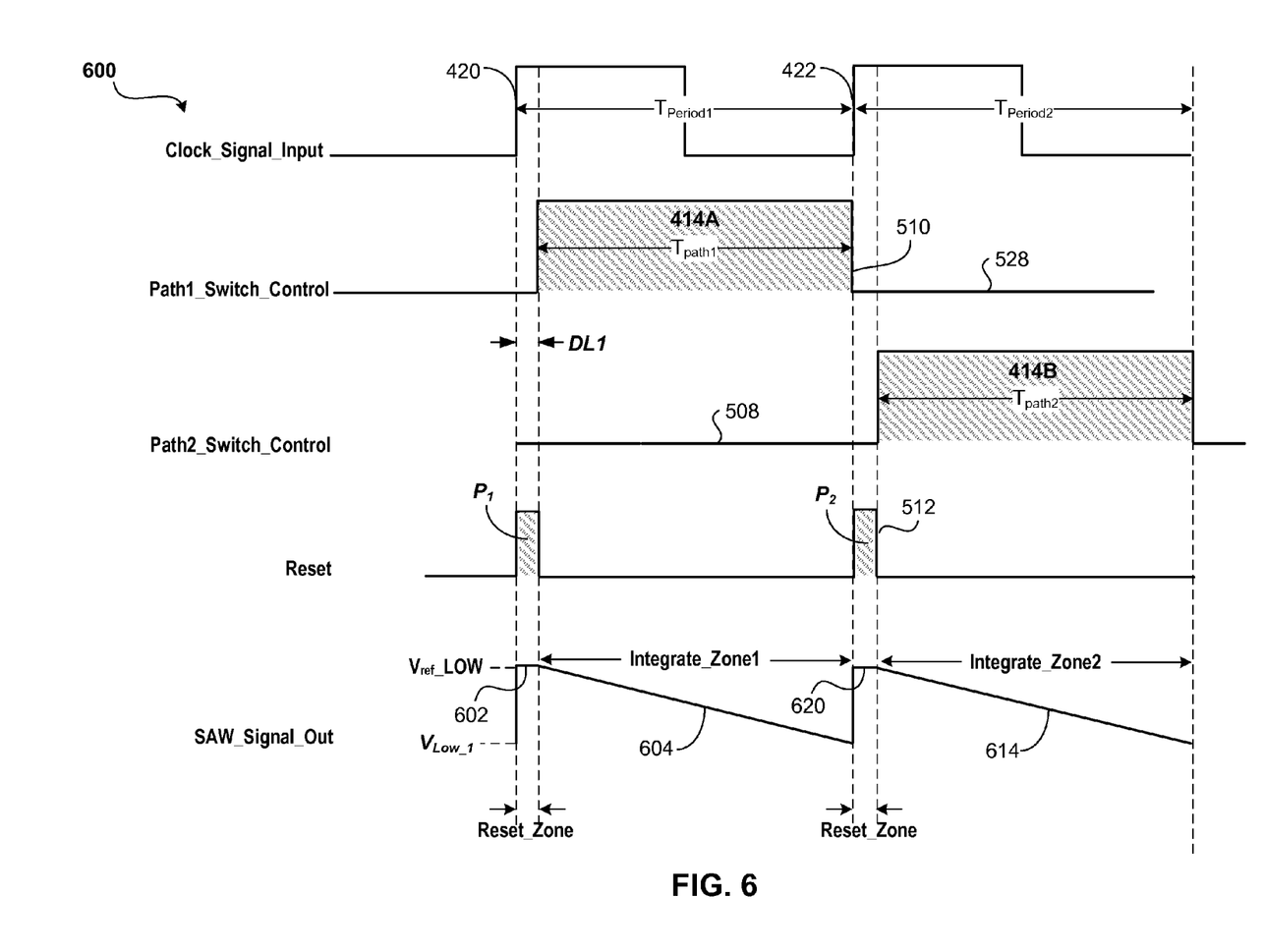
FIG. 6 illustrates timing waveforms corresponding to the ramp generator circuit of FIG. 3, according to one embodiment.

FIG. 6 illustrates timing waveforms 600, which correspond to the operation of ramp generator circuit 300 of FIG. 3, according to one embodiment. In FIG. 6, the Clock_Signal_Input, Path1_Switch_Control, Path2_Switch_Control, and Reset signals are identical to those shown in FIGS. 4B and 5. Thus, the operation of the ramp generator circuit 300 of FIG. 3 is described in the following paragraphs with the aid of the waveforms depicted in FIGS. 4B and 6. On the rising edge 420 of the clock signal Clock_Signal_Input, reset pulse $P_1$ resets the output terminal 320 voltage of the ramp generator 300 (FIG. 3) to $V_{ref\_}$LOW (FIG. 3), as further indicated at 602. Following time delay period DL1, which coincides with the duration of the reset pulse $P_1$, the path 1 switch control signal Path1_Switch_Control generates activation period 414A. Activation period 414A may then be utilized to actuate the position of switches SW'1a (FIG. 3) and SW'1b (FIG. 3) within feedback path 310 (FIG. 3). For example, the activation period 414A may facilitate the actuation of switch SW'1b (FIG. 3) to a closed position and SW'1a (FIG. 3) to an open position. Based on this switch configuration, the first feedback path 310 (FIG. 3) and its corresponding capacitor C'1 (FIG. 3) generate negative slope ramp 604 over the duration $T_{path1}$ of activation period 414A.

During activation period 414A, the path 2 switch control signal Path2_Switch_Control is at a logic low 608, and facilitates the actuation of the position of switches SW2'a (FIG. 3) and SW2b (FIG. 3) within the second feedback path 312 (FIG. 3) to a closed position and an open position, respectively. By SW'2b (FIG. 3) being in an open position, feedback path 312 (FIG. 3) is effectively removed. By closing switch SW2'a (FIG. 3), capacitor C'2 (FIG. 3) within feedback path 312 (FIG. 3) charges along a path to the positive terminal 304 (FIG. 3) of the ramp generator 300, which is held at $V_{ref\_}$LOW (FIG. 3). Moreover during this activation period 414A, the reset signal Reset is at a logic zero, which is indicative of SW'3 (FIG. 3) being in an open position.

At the end of the activation period 414A, as indicated at 510, the next reset pulse $P_2$ actuates SW'3 (FIG. 3) to a closed position on the next rising edge 422 of the clock signal Clock_Signal_Input. Also, at this time instant, both the path 1 switch control signal Path1_Switch_Control and the path 2 switch control signal Path2_Switch_Control are at a logic low, and, therefore, switches SW'1b (FIG. 3) and SW'2b (FIG. 3) are in the open position, and switches SW'1a (FIG. 3) and SW'2a (FIG. 3) are in the closed position. By SW'1b (FIG. 3) and SW'2b (FIG. 3) being in open positions, feedback paths 310 (FIG. 3) and 312 (FIG. 3) are effectively removed. By closing switches SW'1a (FIG. 3) and SW'2a (FIG. 3), capacitors C'1 (FIG. 3) and C'2 (FIG. 3) within feedback paths 310 (FIG. 3) and 312 (FIG. 3) charge along the path to the positive terminal 304 (FIG. 3) of the ramp generator 300 (FIG. 3), which is held at $V_{ref\_}$LOW (FIG. 3). Thus, over the period of reset pulse $P_2$, the voltage at output terminal 320 (FIG. 3) of the ramp generator 300 (FIG. 3) transitions to $V_{ref\_}$LOW, as further indicated at 620.

When the duration of reset pulse $P_2$ finishes, as indicated at 512, the path 2 switch control signal Path2_Switch_Control generates activation period 414B. Activation period 414B may then be utilized to actuate the position of switches SW'2a (FIG. 3) and SW'2b (FIG. 3) within feedback path 312 (FIG. 3). For example, the activation period 414B may facilitate the actuation of switch SW'2b (FIG. 3) to a closed position and SW'2a (FIG. 3) to an open position. Based on this switch configuration, the second feedback path 312 (FIG. 3) and its corresponding capacitor C'2 (FIG. 3) generate negative slope ramp 614 over the duration $T_{path2}$ of activation period 414B.

During activation period 414B, the path 1 switch control signal Path1_Switch_Control is at a logic low 628, and facilitates the actuation of the position of switches SW'1a (FIG. 3) and SW'1b (FIG. 3) within the first feedback path 310 (FIG. 3) to a closed position and an open position, respectively. By SW'1b (FIG. 3) being in an open position, feedback path 310 (FIG. 3) is now effectively removed. By closing switch SW'1a (FIG. 3), capacitor C'1 (FIG. 3) within feedback path 310 (FIG. 3) charges along the path to the positive terminal 304 (FIG. 3) of the ramp generator 300 (FIG. 3), which is held at $V_{ref\_}$LOW (FIG. 3). Moreover during this activation period 414B, the reset signal Reset is at a logic zero, which is indicative of SW'3 (FIG. 3) being in an open position.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A ramp generator circuit for generating a sawtooth waveform based on a clock signal, the ramp generator circuit comprising:
   an operational amplifier having an output terminal and a negative input terminal;
   a first switched capacitor device within a first feedback path located between the output terminal and the negative input terminal;
   a first plurality of switch devices within the first feedback path, wherein upon actuation of the first plurality of switches the first switched capacitor generates first ramp waveforms during first alternate clock periods of the clock signal;
   a second switched capacitor device within a second feedback path located between the output terminal and the negative input terminal; and
   a second plurality of switch devices within the second feedback path, wherein upon actuation of the second plurality of switches the second switched capacitor generates second ramp waveforms during second alternate clock periods of the clock signal, each of the first alternate clock periods of the clock signal being followed by an adjacent one of the second alternate clock periods of the clock signal.

2. The circuit of claim 1, wherein the operational amplifier comprises an input resistor coupled to the negative input terminal that establishes a first time constant corresponding to the first feedback path with the first switched capacitor device.

3. The circuit of claim 2, wherein the input resistor establishes a second time constant corresponding to the second feedback path with the second switched capacitor device.

4. The circuit of claim 1, wherein the first plurality of switch devices comprise:
a first switch that is connected in series with the first switched capacitor between the output terminal of the operational amplifier and the first switched capacitor; and
a second switch that is connected across the first switched capacitor,
wherein during the actuation of the first plurality of switches the first switch is in a closed position and the second switch is in an open position.

5. The circuit of claim 4, wherein the second plurality of switch devices comprise:
a third switch that is connected in series with the second switched capacitor between the output terminal of the operational amplifier and the second switched capacitor; and
a fourth switch that is connected across the second switched capacitor,
wherein during the actuation of the second plurality of switches the third switch is in a closed position and the fourth switch is in an open position.

6. The circuit of claim 1, wherein the first ramp waveform and the second ramp waveform each comprise a positive slope.

7. The circuit of claim 6, wherein the operational amplifier comprises a positive terminal, the positive terminal having a first reference voltage and the negative terminal having a second reference voltage, and wherein the first reference voltage is biased at a higher voltage compared to second reference voltage.

8. The circuit of claim 1, wherein the first ramp waveform and the second ramp waveform each comprise a negative slope.

9. The circuit of claim 8, wherein the operational amplifier comprises a positive terminal, the positive terminal having a first reference voltage and the negative terminal having a second reference voltage, and wherein the first reference voltage is biased at a lower voltage compared to second reference voltage.

10. The circuit of claim 1, further comprising a timing control circuit that receives the clock signal and generates a first switch control signal corresponding to the first plurality of switches, a second switch control signal corresponding to the second plurality of switches, and a reset signal.

11. The circuit of claim 10, wherein the timing control circuit comprises:
a frequency divider that receives the clock signal and generates both a first reference signal having a frequency of half that of the clock signal and a second reference signal that is a complementary version of the first reference signal;
a first delay device that receives the first reference signal and generates a first delayed reference signal;
a second delay device that receives the second reference signal and generates a second delayed reference signal;
a first AND gate that receives both the first reference signal and the first delayed reference signal, the first AND gate generating the first switch control signal;
a second AND gate that receives both the second reference signal and the second delayed reference signal, the second AND gate generating the second switch control signal; and
an XOR gate that receives both the first switch control signal and the second switch control signal, the XOR gate generating the reset signal.

12. The circuit of claim 1, wherein the first feedback path includes a first RC time constant and the second feedback path includes a second RC time constant, the first and the second RC time constant having a substantially identical time constant value.

13. The circuit of claim 1, wherein the first feedback path includes a first RC time constant and the second feedback path includes a second RC time constant, the first and the second RC time constant having a different time constant value.

14. A method of generating a sawtooth waveform based on an operational amplifier, the method comprising:
generating a clock signal;
activating a first negative feedback path associated with the operational amplifier by switching a first capacitor into the first negative feedback path during first alternate clock periods of the clock signal, the first capacitor generating a first ramp waveform; and
activating a second negative feedback path associated with the operational amplifier by switching a second capacitor into the second negative feedback path during second alternate clock periods of the clock signal, the second capacitor generating a second ramp waveform, each of the first alternate clock periods of the clock signal being followed by an adjacent one of the second alternate clock periods of the clock signal.

15. The method of claim 14, wherein during the activating of the first negative feedback path the second capacitor discharges and, wherein during the activating of the second negative feedback path the first capacitor discharges.

16. The method of claim 14, further comprising:
resetting the first ramp waveform prior to the generating of the second ramp waveform; and
resetting the second ramp waveform prior to the generating of the first ramp waveform.

17. The method of claim 14, wherein the first ramp waveform and the second ramp waveform each comprise a positive slope.

18. The method of claim 17, wherein the positive slope is generated by:
applying a first reference voltage to a positive terminal of the operational amplifier;
applying a second reference voltage to a negative terminal of the operational amplifier,
wherein the first reference voltage is biased at a higher voltage compared to second reference voltage.

19. The method of claim 14, wherein the first ramp waveform and the second ramp waveform each comprise a negative slope.

20. The circuit of claim 19, wherein the negative slope is generated by:
applying a first reference voltage to a positive terminal of the operational amplifier;
applying a second reference voltage to a negative terminal of the operational amplifier,
wherein the first reference voltage is biased at a lower voltage compared to second reference voltage.

* * * * *